US008206506B2

(12) United States Patent
Kadkhodayan et al.

(10) Patent No.: US 8,206,506 B2
(45) Date of Patent: Jun. 26, 2012

(54) SHOWERHEAD ELECTRODE

(75) Inventors: Babak Kadkhodayan, Pleasanton, CA (US); Rajinder Dhindsa, San Jose, CA (US); Anthony de la Llera, Fremont, CA (US); Michael C. Kellogg, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 1011 days.

(21) Appl. No.: 12/216,525

(22) Filed: Jul. 7, 2008

(65) Prior Publication Data

US 2010/0000683 A1    Jan. 7, 2010

(51) Int. Cl.
*C23C 16/50* (2006.01)
*C23C 16/503* (2006.01)

(52) U.S. Cl. ............... 118/715; 118/723 E; 156/345.33; 156/345.34; 156/345.43

(58) Field of Classification Search .................. 118/715, 118/723 E; 156/345.33, 345.34, 345.43
See application file for complete search history.

(56) References Cited

U.S. PATENT DOCUMENTS

| | | | |
|---|---|---|---|
| 4,585,920 A | 4/1986 | Hoog et al. | |
| 4,612,077 A | 9/1986 | Tracy et al. | |
| 4,908,095 A | 3/1990 | Kagatsume et al. | |
| 5,074,456 A | 12/1991 | Degner et al. | |
| 5,200,016 A | 4/1993 | Namose | |
| 5,356,515 A | 10/1994 | Tahara et al. | |
| 5,423,936 A | 6/1995 | Tomita et al. | |
| D363,464 S | 10/1995 | Fukasawa | |
| 5,500,256 A | 3/1996 | Watabe et al. | |
| 5,534,751 A | 7/1996 | Lenz et al. | |
| 5,569,356 A | 10/1996 | Lenz et al. | |
| 5,589,002 A | 12/1996 | Su | |
| 5,590,975 A | 1/1997 | Horntvedt | |
| 5,593,540 A | 1/1997 | Tomita et al. | |
| 5,624,498 A | 4/1997 | Lee et al. | |
| 5,740,009 A | 4/1998 | Pu et al. | |
| 5,746,875 A | 5/1998 | Maydan et al. | |
| 5,766,364 A | 6/1998 | Ishida et al. | |
| 5,792,269 A | 8/1998 | Deacon et al. | |
| D411,516 S | 6/1999 | Imafuku et al. | |
| D412,513 S | 8/1999 | Ooyabu | |
| 5,959,409 A | 9/1999 | Dornfest et al. | |
| 5,993,597 A | 11/1999 | Saito et al. | |
| 5,997,649 A | 12/1999 | Hillman | |
| D420,022 S | 2/2000 | Burkhart et al. | |
| 6,024,799 A | 2/2000 | Chen et al. | |
| 6,036,782 A | 3/2000 | Tanaka et al. | |

(Continued)

FOREIGN PATENT DOCUMENTS

JP          56-087667 A        7/1981

(Continued)

OTHER PUBLICATIONS

International Search Report and Written Opinion mailed Feb. 24, 2010 for PCT/US2009/003953.

(Continued)

*Primary Examiner* — Ram Kackar
*Assistant Examiner* — Satish Chandra
(74) *Attorney, Agent, or Firm* — Buchanan Ingersoll & Rooney PC

(57) ABSTRACT

A showerhead electrode includes inner and outer steps at an outer periphery thereof, the outer step cooperating with a clamp ring which mechanically attaches the electrode to a backing plate.

13 Claims, 1 Drawing Sheet

U.S. PATENT DOCUMENTS

| | | | |
|---|---|---|---|
| 6,039,836 | A | 3/2000 | Dhindsa et al. |
| 6,050,216 | A | 4/2000 | Szapucki et al. |
| 6,050,506 | A | 4/2000 | Guo et al. |
| D425,919 | S | 5/2000 | Burkhart et al. |
| 6,079,356 | A | 6/2000 | Umotoy et al. |
| 6,086,710 | A | 7/2000 | Miyashita et al. |
| 6,110,287 | A | 8/2000 | Arai et al. |
| 6,110,556 | A | 8/2000 | Bang et al. |
| 6,132,512 | A | 10/2000 | Horie et al. |
| 6,170,432 | B1 | 1/2001 | Szapucki et al. |
| 6,173,673 | B1 | 1/2001 | Golovato et al. |
| 6,200,415 | B1 | 3/2001 | Maraschin |
| 6,206,972 | B1 | 3/2001 | Dunham |
| D441,348 | S | 5/2001 | Todd et al. |
| 6,228,208 | B1 | 5/2001 | Lill et al. |
| 6,237,528 | B1 | 5/2001 | Szapucki et al. |
| 6,302,964 | B1 | 10/2001 | Umotoy et al. |
| 6,368,450 | B2 | 4/2002 | Hayashi |
| 6,389,677 | B1 | 5/2002 | Lenz |
| 6,432,261 | B2 | 8/2002 | Watanabe et al. |
| 6,444,037 | B1 | 9/2002 | Frankel et al. |
| 6,461,435 | B1 | 10/2002 | Littau et al. |
| 6,477,980 | B1 | 11/2002 | White et al. |
| 6,495,233 | B1 | 12/2002 | Shmurun et al. |
| 6,506,686 | B2 | 1/2003 | Masuda et al. |
| 6,550,126 | B1 | 4/2003 | Szettella et al. |
| 6,553,932 | B2 | 4/2003 | Liu et al. |
| 6,558,506 | B1 | 5/2003 | Freeman et al. |
| 6,586,886 | B1 | 7/2003 | Katz et al. |
| 6,653,734 | B2 | 11/2003 | Flanner et al. |
| 6,723,202 | B2 | 4/2004 | Nagaiwa et al. |
| D490,450 | S | 5/2004 | Hayashi et al. |
| 6,753,498 | B2 | 6/2004 | Sirkis et al. |
| D493,873 | S | 8/2004 | Hayashi |
| 6,786,175 | B2 | 9/2004 | Dhindsa et al. |
| 6,818,096 | B2 | 11/2004 | Barnes et al. |
| 6,827,815 | B2 | 12/2004 | Hytros et al. |
| 6,872,258 | B2 | 3/2005 | Park et al. |
| 6,899,786 | B2 | 5/2005 | Senzaki et al. |
| 6,936,135 | B2 | 8/2005 | Antolik |
| 6,942,753 | B2 | 9/2005 | Choi et al. |
| 7,083,702 | B2 | 8/2006 | Blonigen et al. |
| 6,391,787 | C1 | 9/2006 | Dhindsa et al. |
| 7,159,537 | B2 | 1/2007 | Wickramanayaka et al. |
| 7,166,200 | B2 | 1/2007 | Saigusa et al. |
| 7,196,283 | B2 | 3/2007 | Buchberger, Jr. et al. |
| 7,270,713 | B2 | 9/2007 | Blonigen et al. |
| 7,296,534 | B2 | 11/2007 | Fink |
| 2001/0000104 | A1 | 4/2001 | Li et al. |
| 2002/0048963 | A1 | 4/2002 | Campbell et al. |
| 2002/0139479 | A1 | 10/2002 | Antolik |
| 2002/0179245 | A1 | 12/2002 | Masuda et al. |
| 2003/0127806 | A1 | 7/2003 | Belchuk |
| 2003/0185729 | A1 | 10/2003 | Ko et al. |
| 2004/0074609 | A1 | 4/2004 | Fischer et al. |
| 2004/0108301 | A1 | 6/2004 | Hao et al. |
| 2004/0173313 | A1 | 9/2004 | Beach |
| 2005/0056218 | A1 | 3/2005 | Sun et al. |
| 2005/0116427 | A1 | 6/2005 | Seidel et al. |
| 2005/0133160 | A1 | 6/2005 | Kennedy et al. |
| 2005/0150456 | A1 | 7/2005 | Senzaki et al. |
| 2005/0241765 | A1 | 11/2005 | Dhindsa et al. |
| 2005/0276928 | A1 | 12/2005 | Okumura et al. |
| 2006/0000803 | A1 | 1/2006 | Koshiishi et al. |
| 2006/0016559 | A1 | 1/2006 | Kobayashi et al. |
| 2006/0037701 | A1 | 2/2006 | Koshiishi et al. |
| 2006/0042754 | A1 | 3/2006 | Yoshida et al. |
| 2006/0043067 | A1 | 3/2006 | Kadkhodayan et al. |
| 2006/0066247 | A1 | 3/2006 | Koshiishi et al. |
| 2006/0075969 | A1 | 4/2006 | Fischer |
| 2006/0090704 | A1 | 5/2006 | Ide et al. |
| 2006/0108069 | A1 | 5/2006 | Gernert |
| 2006/0207502 | A1 | 9/2006 | Dhindsa et al. |
| 2006/0236934 | A1 | 10/2006 | Choi et al. |
| 2006/0283551 | A1 | 12/2006 | Son |
| 2006/0283552 | A1 | 12/2006 | Rogers |
| 2007/0032081 | A1 | 2/2007 | Chang et al. |
| 2007/0044716 | A1 | 3/2007 | Tetsuka et al. |
| 2007/0068629 | A1 | 3/2007 | Shih et al. |
| 2007/0131350 | A1 | 6/2007 | Ricci et al. |
| 2007/0137573 | A1* | 6/2007 | Kholodenko et al. .... 118/723 E |
| 2007/0181868 | A1 | 8/2007 | Fujiwara et al. |
| 2007/0187038 | A1 | 8/2007 | Ren et al. |
| 2007/0215580 | A1 | 9/2007 | Koshiishi et al. |
| 2007/0235660 | A1* | 10/2007 | Hudson ...................... 250/423 P |
| 2007/0284045 | A1 | 12/2007 | Fischer et al. |
| 2007/0284246 | A1 | 12/2007 | Keii et al. |
| 2008/0087641 | A1 | 4/2008 | La Llera et al. |
| 2008/0090417 | A1 | 4/2008 | La Llera et al. |
| 2008/0092920 | A1* | 4/2008 | Shih et al. .................... 134/1 |
| 2008/0099120 | A1 | 5/2008 | Larson et al. |
| 2008/0141941 | A1 | 6/2008 | Augustino et al. |
| 2008/0227301 | A1 | 9/2008 | Fang et al. |
| 2008/0308228 | A1 | 12/2008 | Stevenson et al. |
| 2008/0308229 | A1 | 12/2008 | Patrick et al. |
| 2009/0081878 | A1 | 3/2009 | Dhindsa |
| 2009/0095220 | A1 | 4/2009 | Meinhold et al. |
| 2009/0095424 | A1 | 4/2009 | Bettencourt et al. |
| 2009/0163034 | A1 | 6/2009 | Larson et al. |
| 2009/0223932 | A1 | 9/2009 | Hida et al. |
| 2009/0236040 | A1 | 9/2009 | Patrick et al. |
| 2010/0003824 | A1 | 1/2010 | Kadkhodayan et al. |
| 2010/0003829 | A1 | 1/2010 | Patrick et al. |
| 2010/0038033 | A1 | 2/2010 | Hardin et al. |
| 2010/0252197 | A1 | 10/2010 | Kadkhodayan et al. |
| 2010/0261354 | A1 | 10/2010 | Bettencourt et al. |

FOREIGN PATENT DOCUMENTS

| | | |
|---|---|---|
| JP | 07-066180 A | 3/1995 |
| JP | 09-013172 A | 1/1997 |
| JP | 09-245994 A | 9/1997 |
| JP | 2001-085398 A | 3/2001 |
| WO | WO2009/114175 A2 | 9/2009 |

OTHER PUBLICATIONS

Commonly owned U.S. Appl. No. 61/036,862, filed Mar. 14, 2008.
Commonly owned U.S. Appl. No. 11/896,375, filed Aug. 31, 2007.
Commonly owned U.S. Appl. No. 12/216,526, filed Jul. 7, 2008.
Commonly Owned U.S. Appl. No. 12/875,869, filed Sep. 3, 2010.
Commonly Owned U.S. Appl. No. 12/884,269, filed Sep. 17, 2010.
Commonly Owned U.S. Appl. No. 12/903,412, filed Oct. 13, 2010.
Commonly Owned U.S. Appl. No. 12/872,980, filed Aug. 31, 2010.
Commonly Owned U.S. Appl. No. 12/872,982, filed Aug. 31, 2010.
Commonly Owned U.S. Appl. No. 12/872,984, filed Aug. 31, 2010.
Official Action dated Jan. 22, 2010 for Chinese Patent Appln. No. 201020114128.8.

* cited by examiner

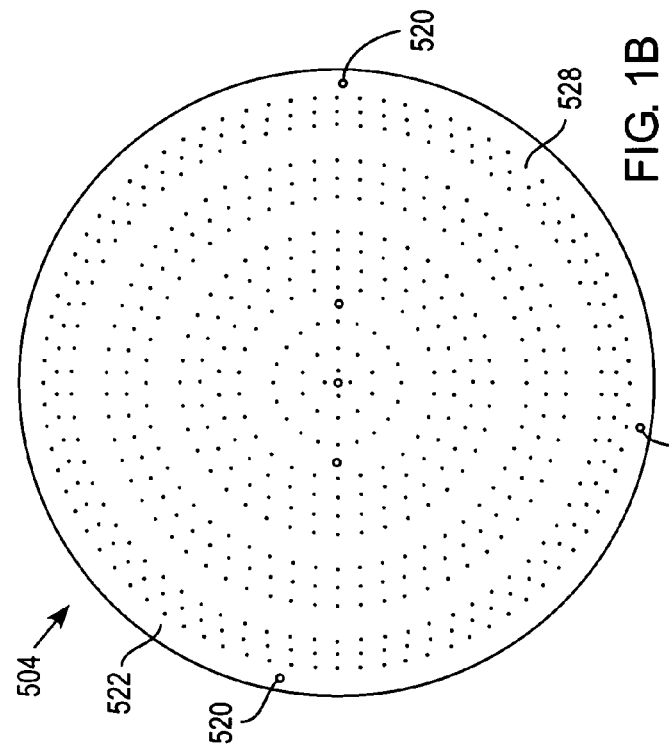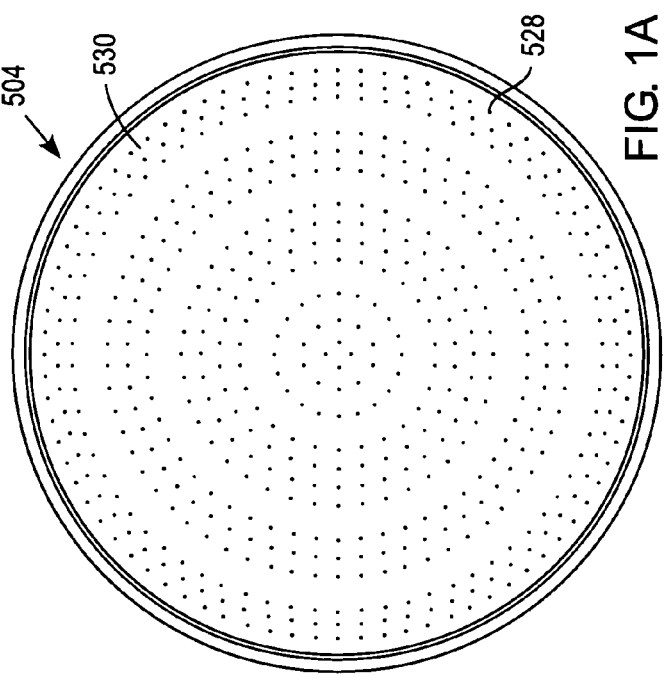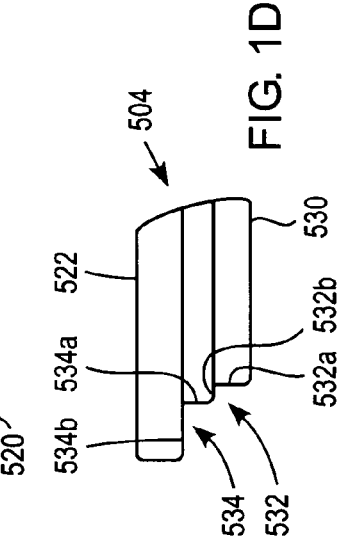

SHOWERHEAD ELECTRODE

FIELD OF THE INVENTION

The invention relates to a showerhead electrode used as an upper electrode in a plasma processing chamber in which semiconductor components can be manufactured.

SUMMARY

A showerhead electrode used as an upper electrode of a capacitively coupled plasma processing chamber comprises a circular plate having a plasma exposed surface on a lower face thereof and a mounting surface on an upper face thereof. The lower face includes inner and outer steps at an outer periphery of the plate. The inner step has a smaller diameter than the outer step and the outer step is located between the inner step and the mounting surface. The outer step is configured to mate with an inwardly extending flange of a clamp ring and the inner step is configured to mate with an inner step of an outer electrode which surrounds the showerhead electrode such that an inner tapered surface of the outer electrode extends from the outer edge of the plasma exposed surface. The mounting surface includes a plurality of alignment pin recesses configured to receive alignment pins arranged in a pattern matching alignment pin holes in a backing plate against which the plate is held by the clamp ring and the plate includes process gas outlets arranged in a pattern matching gas supply holes in the backing plate.

BRIEF DESCRIPTION OF THE DRAWINGS

FIGS. 1A-D show details of the showerhead electrode wherein FIG. 1A shows a front planar view showing the plasma exposed surface of the electrode 504 with the 13 rows of gas holes, FIG. 1B shows a front planar view of the upper face 522 with the 13 rows of gas holes and 6 pin holes 520, FIG. 1C shows a side view with the inner step closest to the plasma exposed surface and the outer step closest to the upper face of the electrode, and FIG. 1D shows an enlarged view of detail D of FIG. 1C.

DETAILED DESCRIPTION

The fabrication of an integrated circuit chip typically begins with a thin, polished slice of high-purity, single-crystal semiconductor material substrate (such as silicon or germanium) called a "wafer." Each wafer is subjected to a sequence of physical and chemical processing steps that form the various circuit structures on the wafer. During the fabrication process, various types of thin films may be deposited on the wafer using various techniques such as thermal oxidation to produce silicon dioxide films, chemical vapor deposition to produce silicon, silicon dioxide, and silicon nitride films, and sputtering or other techniques to produce other metal films.

After depositing a film on the semiconductor wafer, the unique electrical properties of semiconductors are produced by substituting selected impurities into the semiconductor crystal lattice using a process called doping. The doped silicon wafer may then be uniformly coated with a thin layer of photosensitive, or radiation sensitive material, called a "resist." Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating.

The lithographed resist pattern is then transferred onto the underlying crystalline surface of the semiconductor material through a process known as etching. Vacuum processing chambers are generally used for etching and chemical vapor deposition (CVD) of materials on substrates by supplying an etching or deposition gas to the vacuum chamber and application of a radio frequency (RF) field to the gas to energize the gas into a plasma state.

A reactive ion etching system typically consists of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$, HBr, $Cl_2$ and $SF_6$ or mixtures thereof with $O_2$, $N_2$, He or Ar is introduced into the etching chamber and maintained at a pressure which is typically in the millitorr range. The upper electrode is provided with gas hole(s), which permit the gas to be uniformly dispersed through the electrode into the chamber. The electric field established between the anode and the cathode will dissociate the reactive gas forming plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched sidewalls. The etching reactor electrodes may often be fabricated by bonding two or more dissimilar members with mechanically compliant and/or thermally conductive adhesives, allowing for a multiplicity of function.

FIGS. 1A-D show details of showerhead electrode 504. The electrode 504 is preferably a plate of high purity (less than 10 ppm impurities) low resistivity (0.005 to 0.02 ohm-cm) single crystal silicon with alignment pin holes 520 in an upper face (mounting surface) 522 which receive alignment pins 524 and steps in an outer edge 526 which mate with a clamp ring (not shown) and an inner lip of an outer electrode (not shown). Gas holes 528 of suitable diameter and/or configuration (e.g., 0.017 inch diameter holes) extend from the upper face to the lower face (plasma exposed surface) 530 and can be arranged in any suitable pattern. In the embodiment shown, the gas holes are arranged in 13 circumferentially extending rows with 4 gas holes in the first row located about 0.25 inch from the center of the electrode, 10 gas holes in the second row located about 0.7 inch from the center, 20 gas holes in the third row located about 1.25 inches from the center, 26 gas holes in the fourth row located about 1.95 inches from the center, 30 gas holes in the fifth row located about 2.3 inches from the center, 36 gas holes in the sixth row located about 2.7 inches from the center, 40 gas holes in the seventh row located about 3.05 inches from the center, 52 gas holes in the eighth row located about 3.75 inches from the center, 58 gas holes in the ninth row located about 4.1 inches from the center, 62 gas holes in the tenth row located about 4.5 inches from the center, 70 gas holes in the eleventh row located about 5.2 inches from the center, 74 gas holes in the twelfth row located about 5.45 inches from the center and 80 holes in the thirteenth row located about 5.75 inches from the center.

The upper face of the electrode includes 6 alignment pin holes 520 with 3 pin holes near the center and 3 pin holes near the outer edge of the electrode. The pin holes can have diameters of about 0.116 inch. The 3 central pin holes are radially aligned and include a pin hole about 0.160 inch deep at the center of the electrode and 2 pin holes about 0.200 inch deep located about 1.6 inches from the center pin hole at locations between the third and fourth row of gas holes. The outer pin holes are about 0.100 inch deep and include one pin hole radially aligned with the central pin holes about 6 inches from the center pin hole and two other pin holes offset 97.5° and 170° therefrom with the second and the third outer pin holes the same distance from the center pin hole but offset 92.5° from each other.

The outer steps include an inner step 532 and an outer step 534 machined into the silicon plate so as to extend completely around the silicon plate. In a preferred embodiment, the silicon plate has a thickness of about 0.400 inch and an outer diameter of about 12.560 inch, the inner step 532 has an inner diameter of about 12.004 inches, an outer diameter of about 12.135 inch and extends about 0.13 inch into the plasma exposed surface 530 and the outer step 534 has an inner diameter of about 12.135 inches and an outer diameter of about 12.560 inches and extends about 0.24 inch into the plasma exposed surface 530. The inner step 532 has a vertical surface 532a about 0.13 inch long and a horizontal surface 532b about 0.065 inch long and the outer step 534 has a vertical surface 534a about 0.11 inch long and a horizontal surface 534b about 0.218 inch long.

FIG. 1A shows a front planar view showing the plasma exposed surface 530 of the electrode 504 with the 13 rows of gas holes. FIG. 1B shows a front planar view of the upper face 522 with the 13 rows of gas holes and 6 pin holes 520. FIG. 1C shows a side view with the inner step closest to the plasma exposed surface and the outer step closest to the upper face of the electrode. FIG. 1D shows an enlarged view of detail D of FIG. 1C showing the inner and outer steps with 6 rounded corners provided at the outer edge of the upper face 522, the outer edge of the lower face 530 and transitions between the horizontal and vertical surfaces 532a, 532b, 534a, 534b with corners of each other and the upper and lower faces 522, 530 (e.g., rounded with a 0.025 inch radius).

While the invention has been described in detail with reference to specific embodiments thereof, it will be apparent to those skilled in the art that various changes and modifications can be made, and equivalents employed, without departing from the scope of the appended claims.

What is claimed is:

1. A showerhead electrode for use as an upper electrode of a capacitively coupled plasma processing chamber, comprising:
a circular plate having a plasma exposed surface on a lower face thereof, a mounting surface on an upper face thereof, the lower face including inner and outer steps at an outer periphery of the plate;
the inner step having a smaller diameter than the outer step and the outer step being located between the inner step and the mounting surface, the outer step including a horizontal surface which extends inwardly from the outer periphery and the inner step including a horizontal surface which extends inwardly from the outer step;
the mounting surface including a plurality of alignment pin recesses;
the plate including process gas outlets arranged in a pattern, the gas outlets communicating with gas passages extending between the upper and lower faces;
wherein the outer step includes a horizontal surface which extends inwardly from the outer periphery by a first distance, the inner step includes a horizontal surface which extends inward from the outer step by a second distance, the first distance being at least two times larger than the second distance and wherein the first and the second distances are no greater than 0.28 inch;
wherein the plate has parallel upper and lower faces with a thickness between the upper and lower faces of no greater than 0.5 inch, the horizontal surface of the outer step is spaced from the upper face by a first vertical distance, the horizontal surface of the inner step is spaced from the lower face by a second vertical distance, and the horizontal surface of the outer step is separated from the horizontal surface of the inner step by a third distance, the first vertical distance being greater than the second vertical distance and the second vertical distance being greater than the third vertical distance.

2. The electrode of claim 1, wherein the alignment pin recesses include a center pin recess, at least one intermediate pin recess on opposite sides of the center pin recess, and a plurality of pin recesses circumferentially spaced apart in an outer zone of the upper face overlying the inner and outer steps.

3. The electrode of claim 1, wherein the plate is of single crystal silicon.

4. The electrode of claim 3, wherein the single crystal silicon has less than 10 ppm impurities and a resistivity of 0.005 to 0.02 ohm-cm.

5. The electrode of claim 1, wherein the gas outlets are arranged in a pattern of circumferential rows.

6. The electrode of claim 5, wherein the pattern of gas outlets includes 13 circumferential rows arranged in groups of 3 or 4 rows with radial distances between adjacent rows of each group smaller than radial distances separating adjacent groups of rows.

7. The electrode of claim 6, wherein the pattern of gas outlets includes a first group of 3 circumferential rows, a second group of 4 circumferential rows, a third group of 3 circumferential rows and a fourth group of 3 circumferential rows.

8. The electrode of claim 5, wherein the pattern of circumferential rows includes a first row of 4 holes located about 0.25 inch from a center of the plate, a second row of 10 holes located about 0.7 inch from the center, a third row of 20 holes located about 1.25 inches from the center, a fourth row of 26 holes located about 1.95 inches from the center, a fifth row of 30 holes located about 2.3 inches from the center, a sixth row of 36 holes located about 2.7 inches from the center, a seventh row of 40 holes located about 3.05 inches from the center, an eighth row of 52 holes located about 3.75 inches from the center, a ninth row of 58 holes located about 4.1 inches from the center, a tenth row of 62 holes located about 4.5 inches from the center, an eleventh row of 70 holes located about 5.2 inches from the center, a twelfth row of 74 holes located about 5.45 inches from the center, and a thirteenth row of 80 holes located about 5.75 inches from the center.

9. The electrode of claim 1, wherein the plate has a thickness of about 0.4 inch and an outer diameter of about 12.56 inches.

10. The electrode of claim 9, wherein the alignment pin recesses include a center pin hole at a center of the plate, two pin holes about 1.6 inches from the center pin hole, and three outer pin holes about 6 inches from the center pin hole, the three outer pin holes being arranged such that a first outer pin hole is offset by 97.5° and 170° from second and third outer pin holes and the second and third outer pin holes are offset by 92.5° from each other.

11. The electrode of claim 9, wherein the inner step has an inner diameter of about 12 inches, an outer diameter of about 12.135 inches, and extends about 0.13 inch into the plasma exposed surface.

12. The electrode of claim 11, wherein the outer step has an inner diameter of about 12.135 inches, an outer diameter of about 12.56 inches, and extends about 0.24 inch into the plasma exposed surface.

13. The electrode of claim 9, wherein the inner step has a horizontal surface about 0.065 inch long and the outer step has a horizontal surface about 0.218 inch long.

* * * * *